United States Patent
Li et al.

(10) Patent No.: US 9,576,880 B2
(45) Date of Patent: Feb. 21, 2017

(54) DUAL DAMASCENE STRUCTURE WITH LINER

(71) Applicant: INTERNATIONAL BUSINESS MACHINES CORPORATION, Armonk, NY (US)

(72) Inventors: Baozhen Li, South Burlington, VT (US); Chih-Chao Yang, Glenmont, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/517,131

(22) Filed: Oct. 17, 2014

(65) Prior Publication Data

US 2015/0035155 A1    Feb. 5, 2015

Related U.S. Application Data

(62) Division of application No. 13/732,825, filed on Jan. 2, 2013, now Pat. No. 9,312,203.

(51) Int. Cl.
| | |
|---|---|
| *H01L 23/48* | (2006.01) |
| *H01L 21/76* | (2006.01) |
| *H01L 29/24* | (2006.01) |
| *H01L 21/768* | (2006.01) |
| *H01L 23/482* | (2006.01) |
| *H01L 23/532* | (2006.01) |

(52) U.S. Cl.
CPC ....... *H01L 23/481* (2013.01); *H01L 21/76847* (2013.01); *H01L 21/76864* (2013.01); *H01L 21/76871* (2013.01); *H01L 21/76873* (2013.01); *H01L 21/76877* (2013.01); *H01L 21/76882* (2013.01); *H01L 23/4827* (2013.01); *H01L 23/53238* (2013.01); *H01L 2924/0002* (2013.01)

(58) Field of Classification Search
CPC ................... H01L 21/76877; H01L 23/53223; H01L 21/76838; H01L 23/5226; H01L 21/76843
USPC .................................. 438/629–648, 666–675
See application file for complete search history.

(56) References Cited

U.S. PATENT DOCUMENTS

| | | | |
|---|---|---|---|
| 5,585,673 A | 12/1996 | Joshi et al. | |
| 5,695,810 A | 12/1997 | Dubin et al. | |
| 5,930,669 A | 7/1999 | Uzoh | |
| 6,258,707 B1 | 7/2001 | Uzoh | |
| 6,323,554 B1 | 11/2001 | Joshi et al. | |

(Continued)

OTHER PUBLICATIONS

Office Action for related U.S. Appl. No. 13/732,825, dated Oct. 24, 2014, 18 pages.

(Continued)

*Primary Examiner* — John C Ingham
*Assistant Examiner* — Didarul Mazumder
(74) *Attorney, Agent, or Firm* — David Cain; Andrew M. Calderon; Roberts, Mlotkowski, Safran, Cole & Calderon, P.C.

(57) ABSTRACT

A dual damascene structure with an embedded liner and methods of manufacture are disclosed. The method includes forming a dual damascene structure in a substrate. The method further includes reflowing a seed layer such that material of the seed layer flows into a via of the dual damascene structure. The method further includes forming a liner material on the material over or within the via of the dual damascene structure. The method further includes filling any remaining portions of the via and a trench of the dual damascene structure with additional material.

10 Claims, 4 Drawing Sheets

(56) References Cited

U.S. PATENT DOCUMENTS

| | | |
|---|---|---|
| 6,342,733 B1 | 1/2002 | Hu et al. |
| 6,433,429 B1 | 8/2002 | Stamper |
| 6,706,625 B1 | 3/2004 | Sudijono et al. |
| 6,787,460 B2 | 9/2004 | Lee et al. |
| 6,835,660 B2 | 12/2004 | Usami |
| 6,849,927 B2 | 2/2005 | Farrar |
| 6,852,167 B2 | 2/2005 | Ahn |
| 6,864,169 B2 | 3/2005 | Noguchi et al. |
| 6,930,045 B2 | 8/2005 | Ikeda |
| 6,933,230 B2 | 8/2005 | Dubin |
| 6,952,052 B1 | 10/2005 | Marathe et al. |
| 6,974,767 B1 | 12/2005 | Lopatin |
| 6,984,891 B2 | 1/2006 | Ahn et al. |
| 6,995,470 B2 | 2/2006 | Ahn et al. |
| 7,067,421 B2 | 6/2006 | Ahn et al. |
| 7,091,611 B2 | 8/2006 | Ahn et al. |
| 7,105,914 B2 | 9/2006 | Farrar |
| 7,121,919 B2 | 10/2006 | Farrar |
| 7,160,577 B2 | 1/2007 | Ahn et al. |
| 7,211,512 B1 | 5/2007 | Ahn et al. |
| 7,220,665 B2 | 5/2007 | Farrar |
| 7,229,924 B2 | 6/2007 | Farrar |
| 7,232,757 B2 | 6/2007 | Noguchi et al. |
| 7,244,677 B2 | 7/2007 | Ritzdorf et al. |
| 7,253,108 B2 | 8/2007 | Zonca |
| 7,253,501 B2 | 8/2007 | Lee et al. |
| 7,253,521 B2 | 8/2007 | Ahn et al. |
| 7,262,130 B1 | 8/2007 | Ahn et al. |
| 7,262,505 B2 | 8/2007 | Ahn et al. |
| 7,273,810 B2 | 9/2007 | Naruse et al. |
| 7,279,411 B2 | 10/2007 | Agarwala et al. |
| 7,300,882 B2 | 11/2007 | Sakata |
| 7,301,190 B2 | 11/2007 | Farrar |
| 7,368,378 B2 | 5/2008 | Ahn et al. |
| 7,378,737 B2 | 5/2008 | Farrar |
| 7,391,115 B2 | 6/2008 | Usami et al. |
| 7,394,157 B2 | 7/2008 | Farrar |
| 7,402,516 B2 | 7/2008 | Ahn et al. |
| 7,410,668 B2 | 8/2008 | Ahn |
| 7,422,979 B2 | 9/2008 | Michaelson et al. |
| 7,451,411 B2 | 11/2008 | Hau-Riege et al. |
| 7,462,269 B2 | 12/2008 | Ritzdorf et al. |
| 7,504,674 B2 | 3/2009 | Farrar |
| 7,535,103 B2 | 5/2009 | Farrar |
| 7,670,943 B2 | 3/2010 | Yang et al. |
| 7,732,924 B2 | 6/2010 | Chanda et al. |
| 7,790,609 B2 | 9/2010 | Hong |
| 7,952,146 B2 | 5/2011 | Yang et al. |
| 8,372,739 B2 | 2/2013 | Ishizaka et al. |
| 2003/0143835 A1 | 7/2003 | Lee |
| 2004/0113279 A1 | 6/2004 | Chen et al. |
| 2004/0180188 A1 | 9/2004 | Nakata et al. |
| 2005/0245068 A1 | 11/2005 | Gambino et al. |
| 2007/0284736 A1* | 12/2007 | Yang ............... H01L 21/76844 257/734 |
| 2008/0057198 A1* | 3/2008 | Yoon et al. ............ 427/250 |
| 2009/0194875 A1* | 8/2009 | Yang et al. ............ 257/751 |
| 2010/0164108 A1 | 7/2010 | Johnston et al. |
| 2010/0244256 A1 | 9/2010 | Kato et al. |
| 2012/0196434 A1 | 8/2012 | Thei et al. |
| 2013/0026635 A1* | 1/2013 | Yang et al. ............ 257/762 |
| 2013/0127056 A1* | 5/2013 | Yun et al. ............ 257/751 |

OTHER PUBLICATIONS

Final Office Action dated Mar. 26, 2015 in related U.S. Appl. No. 13/732,825, 22 pages.
Office Action dated Sep. 4, 2015 in related U.S. Appl. No. 13/732,825, 13 pages.
Notice of Allowance dated Jan. 5, 2016 in related U.S. Appl. No. 13/732,825, 10 pages.

* cited by examiner

DUAL DAMASCENE STRUCTURE WITH LINER

FIELD OF THE INVENTION

The invention relates to semiconductor structures and, more particularly, to a dual damascene structure with an embedded liner and methods of manufacture.

BACKGROUND

The demand for high performance in advanced ULSI circuits requires a copper interconnect to carry high current density. This places severe challenges on copper interconnect reliability, especially concerning electromigration issues. Electromigration decreases the reliability of integrated circuits (ICs), with eventual loss of connections or failure of the circuit. Also, with increasing miniaturization, the probability of failure due to electromigration increases in very-large-scale integration (VLSI) and ultra-large-scale integration (ULSI) circuits because both the power density and the current density increase. Thus, as the structure size in ICs decreases, the practical significance of the electromigration effect increases.

In advanced semiconductor manufacturing processes, copper has replaced aluminum as the interconnect material of choice. Despite its greater fragility in the fabrication process, copper is intrinsically less susceptible to electromigration. However, electromigration continues to be an ever present challenge to device fabrication.

In dual damascene Cu interconnects, the via has been the weakest link for electromigration, especially for the via depletion mode, i.e., for electrons flowing from a dual damascene via upwards into a line. The common electromigration failure for this mode is void formation within the via. With the technology scaling, a void in the via needed to cause an electromigration failure becomes smaller, and consequently, the failure time becomes shorter.

Accordingly, there exists a need in the art to overcome the deficiencies and limitations described hereinabove.

SUMMARY

In an aspect of the invention, a method comprises forming a dual damascene structure in a substrate. The method further comprises reflowing a seed layer such that material of the seed layer flows into a via of the dual damascene structure. The method further comprises forming a liner material on the material over or within the via of the dual damascene structure. The method further comprises filling any remaining portions of the via and a trench of the dual damascene structure with additional material.

In an aspect of the invention, a method comprises forming a dual damascene structure in a single dielectric layer, comprising a via of a first cross section and a trench of a second cross section larger than the first cross section. The method further comprises lining the via and the trench with a liner and a seed layer. The method further comprises reflowing the seed layer such that it partially or completely fills the via. The method further comprises forming a blocking liner over the reflowed seed layer which partially or completely fills the via. The method further comprises forming additional material in the trench on the blocking liner and within any remaining portions of the via.

In an aspect of the invention, a structure comprises a via interconnect in a dielectric material comprising a liner and a conductive material. The structure further comprises an upper wiring layer in the dielectric material and in alignment with the via interconnect. The upper wiring layer comprises a liner and the conductive material. The structure further comprises a blocking liner embedded within the conductive material over the via interconnect and below the upper wiring layer which is located such that void formation due to electromigration or stress migration is prevented in the via interconnect.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the dual damascene structure with an embedded liner, which comprises the structures of the present invention. In still further embodiments, a method in a computer-aided design system is provided for generating a functional design model of the dual damascene structure with the embedded liner. The method comprises generating a functional representation of the structural elements of the dual damascene structure with the embedded liner.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to a dual damascene structure with embedded liner and methods of manufacture. Advantageously, in embodiments, the dual damascene structure with embedded liner provides enhanced electromigration performance. Also, advantageously, the present invention provides a low cost solution to enhance the copper interconnect electromigration performance to meet the advanced ULSI needs, e.g., copper interconnects carrying high current density.

In embodiments, the present invention modifies a dual damascene process and structure to significantly slow down Cu diffusion out of the via by use of an embedded or blocking liner on a top portion of a via interconnect. In more specific embodiments, the device of the present invention will mitigate electromigration effects by using an embedded liner within or on a surface of a via interconnect formed with the dual damascene process. In this way, the blocking liner will prevent void formation within the via interconnect, and thus enhance electromigration performance.

In embodiments, the methods of the present invention include patterning of a dual damascene structure in a substrate, e.g., single dielectric layer such as oxide, or any low K dielectric materials. The dual damascene structure includes a via (for forming a via interconnect) and a trench (for forming an upper wiring layer). In embodiments, the via is lined with a metal material, e.g., Ta(N), Co(N), etc., and then seeded with a metal layer, e.g., copper. The seed layer is then reflowed to partially or completely fill the via to form the via interconnect. A liner is then deposited on the reflowed metal layer. Any remaining portion of the via and trench is then filled with conductive material, e.g., copper, to complete the structure, e.g., form an upper wiring layer of the present invention. In embodiments, a chemical mechanical polishing (CMP) process can be performed on the upper wiring layer. Advantageously, this solution should have minimal impact on Cu electrical resistivity.

Figure 1:
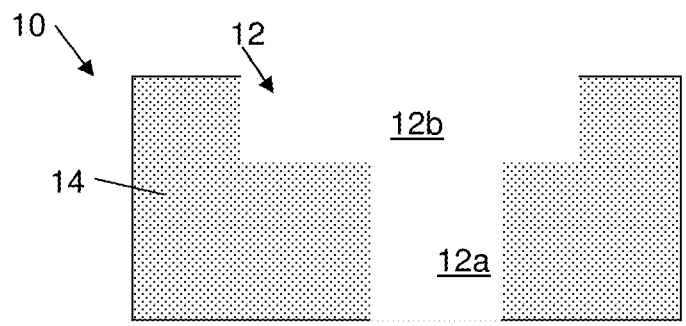
FIGS. 1, 2, 3, 4a, 4b, 5, and 6 show structures and respective processing steps in accordance with aspects of the present invention.

FIG. 1 shows a structure and respective processing steps in accordance with aspects of the present invention. Specifically, FIG. 1 shows a structure 10 comprising a dual damascene structure 12 formed within a substrate, e.g., dielectric 14. As should be understood by those of skill in the art, the dual damascene structure 12 includes a via 12a and a trench 12b for an upper wiring layer. The via 12a is used to form a via interconnect, which connects to a lower wiring layer or device and the upper wiring layer formed within the trench 12b. In embodiments, the via 12a is smaller in cross section than the trench 12b. Also, those of skill in the art should understand that using a dual damascene process to form the dual damascene structure 12, saves considerable cost and fabrication time compared to using single damascene process.

In embodiments, the dual damascene structure 12 can be formed using conventional dual damascene processes, known to those of skill in the art such that no further explanation is required for an understanding of the present invention. For example, a conventional dual damascene lithography process includes forming a resist, exposing the resist to energy (light) to form a pattern (openings), and etching the dielectric layer through the openings to form the via 12a and the trench 12b, in separate processing steps.

Figure 2:
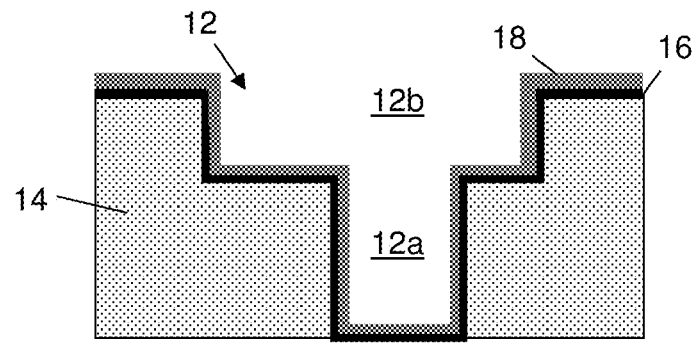

In FIG. 2, a liner 16 is formed on the surface of the dielectric 14 including within the dual damascene structure 12, e.g., the via 12a and the trench 12b. The structure is devoid of any SiN layer between the via 12a and the trench 12b, which would otherwise be required in single damascene processes. In embodiments, the liner 16 can be a metal liner formed by a plasma vapor deposition (PVD) or a chemical vapor deposition (CVD) process. The metal liner 16 can be, for example, Ta(N), Co(N), Ru(N), Ir, Rh, Pt or Pb, as some non-limiting examples. The metal liner 16 can be formed to a thickness of about 3 nm to 10 nm; although other dimensions are contemplated by the present invention.

In embodiments, a seed layer 18 is formed on the metal liner 16. The seed layer 18 can be a copper seed layer formed to a thickness of about 10 nm to 300 nm and more preferably to a thickness of about 10 nm to 100 nm; although other dimensions are contemplated by the present invention. In embodiments, the seed layer 18 is formed by any conventional deposition method.

Figure 3:
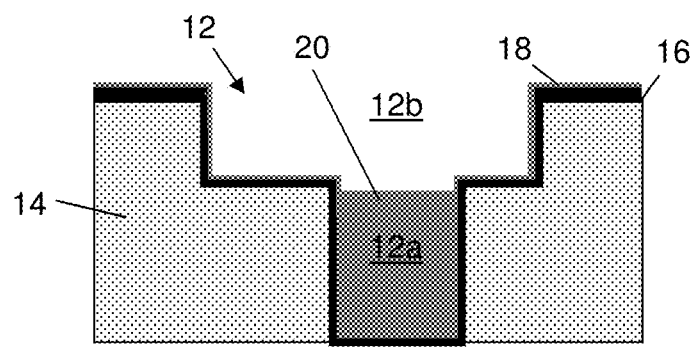

In FIG. 3, the seed layer 18 undergoes a reflow anneal process to partially or completely fill the via 12a, thereby forming a via interconnect as represented by reference numeral 20. In embodiments, the reflow anneal is performed at approximately 250° C. In embodiments, the reflow anneal will reflow copper into the via 12a to partially or completely fill the via 12a, depending on the thickness of the seed layer and the dimensions of the via 12a. For example, a thinner layer of seed material in combination with a larger dimension via 12a will result in a partial fill of the via 12a; whereas, a thicker layer of seed material in combination with a smaller dimension via 12a may result in a complete fill of the via 12a. In embodiments, the trench 12b will not be filled at this processing step. In embodiments, the reflow process will considerably reduce or eliminate the seed layer 18 on remaining surfaces of the dielectric 14. For example, FIG. 3 shows a considerable reduction in thickness of the seed layer 18, compared to that shown in FIG. 2.

Figure 4A:
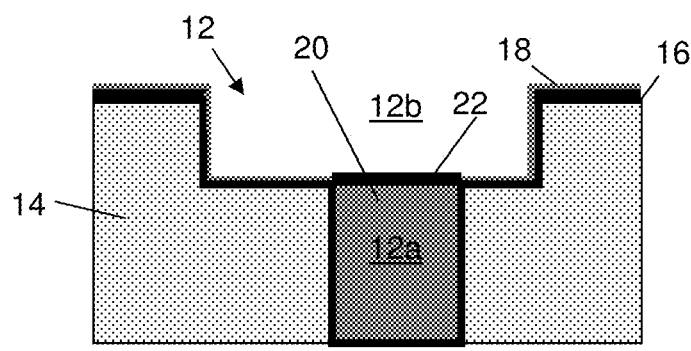
Figure 4B:
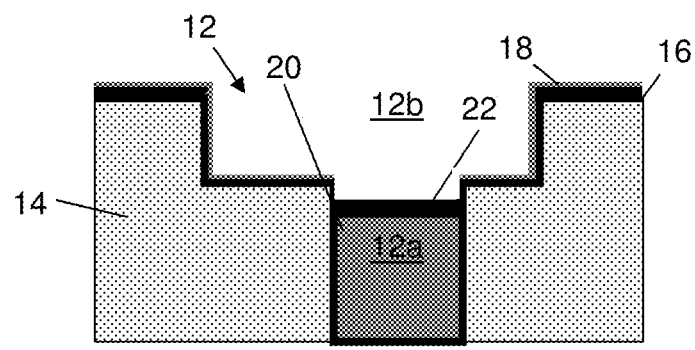

FIGS. 4a and 4b show structures and related processing steps in accordance with aspects of the present invention. Specifically, FIG. 4a represents the via 12a completely filled with metal, e.g., copper reflow; whereas, FIG. 4b represents the via 12a partially filled with metal, e.g., copper reflow. In either scenario, a liner material 22 (e.g., blocking liner for Cu diffusion) is deposited on the metal, i.e., via interconnect 20. The blocking liner 22 is thus shown to be on a top of the completed via interconnect 20 (FIG. 4a) or on the metal within the via 12a (FIG. 4b). In embodiments, the blocking liner 22 is selectively deposited on the metal, and can comprise Ta(N), Co(N), Ru(N), Ir, Rh, Pt or Pb, as some examples. In embodiments, the blocking liner 22 can alternatively be deposited by a blanket deposition process on the via interconnect 20 and any exposed liner 18.

In embodiments, the blocking liner 22 can be deposited to a thickness of 3-10 nm; although other dimensions are also contemplated by the present invention. As should be understood by those of skill in the art, the blocking liner 22 will prevent a void formation in the via interconnect which would otherwise result due to Cu diffusion caused by electromigration or stress migration.

Figure 5:
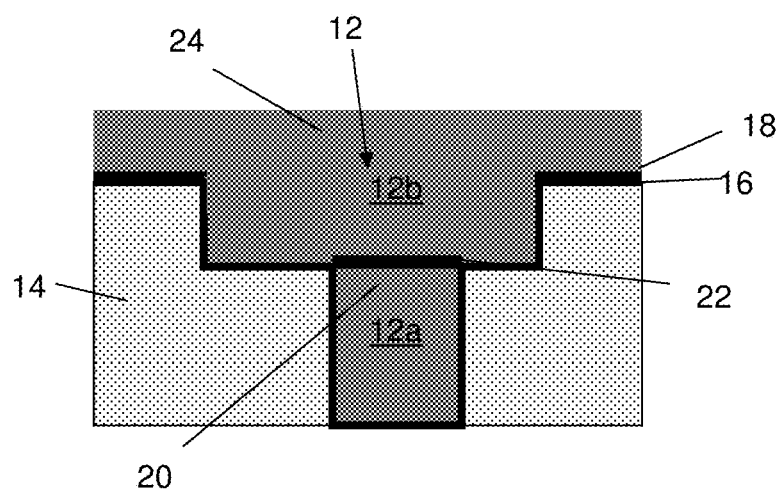

Continuing from either FIG. 4a or 4b, in FIG. 5, the remaining portion of the dual damascene structure 12 is filled with conductive metal 24. For example, a seed layer, e.g., copper seed layer, can be provided on the blocking liner 22 and the metal liner 16 (or seed layer 18 if any is still present), and then a metal 24 can be formed on the metal liner 16 (or seed layer 18). In embodiments, the conductive metal 24 is a copper material which is formed by electroplating. The conductive metal 24 will be in electrical contact with the via interconnect 20.

Figure 6:
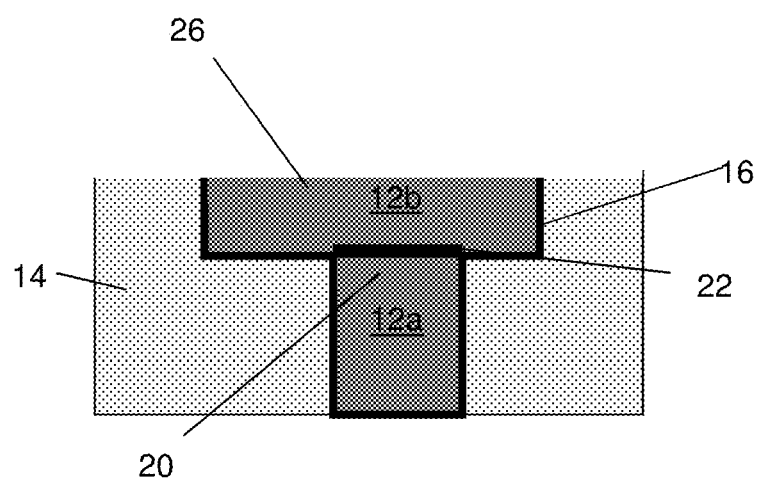

In FIG. 6, the metal is planarized to form an upper wiring layer 26. The metal can be planarized using a conventional chemical mechanical polishing (CMP) process. In embodiments, any exposed liner on a top surface of the dielectric 14 can also be removed.

Figure 7:
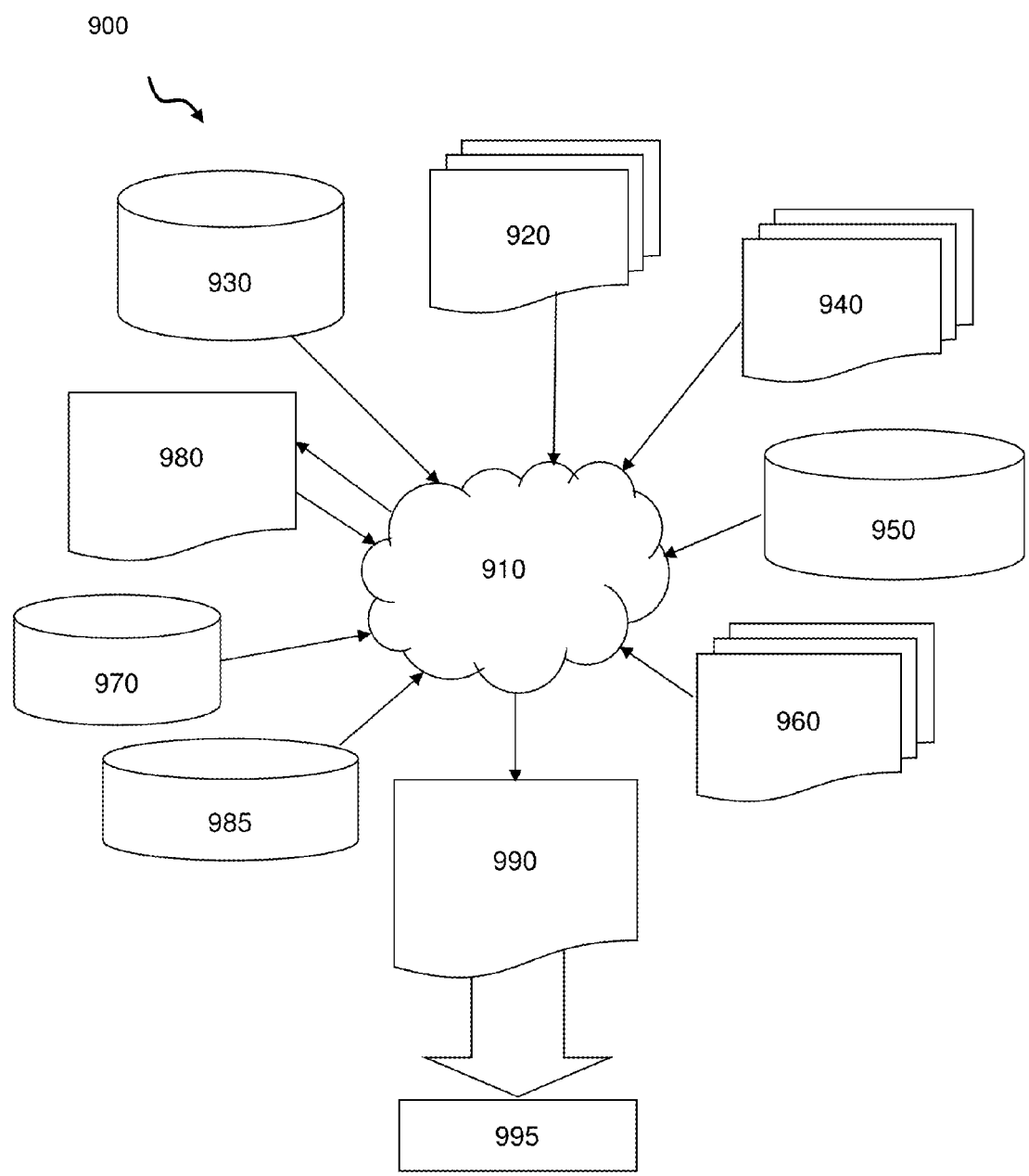
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2, 3, 4a, 4b, 5, and 6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2, 3, 4a, 4b, 5, and 6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2, 3, 4a, 4b, 5, and 6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2, 3, 4a, 4b, 5, and 6. In one embodiment, design structure 990 may comprise a compiled, executable HDL simulation model that functionally simulates the devices shown in FIGS. 1, 2, 3, 4a, 4b, 5, and 6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, 3, 4a, 4b, 5, and 6. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
    a via interconnect in a dielectric material comprising a liner and a conductive material;
    an upper wiring layer in the dielectric material and in alignment with the via interconnect, the upper wiring layer comprising a liner and the conductive material;
    a diffusion blocking liner embedded within the conductive material over the via interconnect and below the liner of the upper wiring layer which is located such that void formation due to electromigration or stress migration is prevented in the via interconnect; and
    a seed layer on the liner of the upper wiring layer,
    wherein the diffusion blocking liner is devoid of the seed layer, and
    the via interconnect and the upper wiring layer are a dual damascene structure, and the via interconnect partially fills a via of the dual damascene structure such that the diffusion blocking liner is embedded within the conductive material at a top portion of the partially filled via.

2. The structure of claim 1, wherein the via interconnect comprises a seed layer of copper.

3. The structure of claim 1, wherein the diffusion blocking liner is a Cu diffusion blocking liner.

4. The structure of claim 1, wherein the diffusion blocking liner is TaN, CoN, RuN, Ir, Rh, Pt or Pb.

5. The structure of claim 1, wherein the via interconnect is smaller in cross section than the upper wiring layer.

6. The structure of claim 1, wherein the conductive material of the upper wiring layer is in electrical contact with the via interconnect.

7. The structure of claim 1, wherein the diffusion blocking liner has a thickness in a range of 3-10 nm, and the liner of the upper wiring layer has a thickness in a range of 3-10 nm.

8. The structure of claim 1, further comprising a vertical liner material which lines sidewalls of the via interconnect.

9. The structure of claim 8, wherein the diffusion blocking liner is only over a seed layer of copper that is within the via interconnect of the dual damascene structure and a portion of the vertical liner material.

10. The structure of claim 9, wherein the diffusion blocking liner is separate from the liner of the upper wiring layer.

* * * * *